(12) United States Patent
Balakrishnan et al.

(10) Patent No.: US 10,230,005 B2
(45) Date of Patent: Mar. 12, 2019

(54) FOUR TERMINAL STACKED COMPLEMENTARY JUNCTION FIELD EFFECT TRANSISTORS

(71) Applicant: INTERNATIONAL BUSINESS MACHINES CORPORATION, Armonk, NY (US)

(72) Inventors: Karthik Balakrishnan, White Plains, NY (US); Bahman Hekmatshoartabari, White Plains, NY (US); Tak H. Ning, Yorktown Heights, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/617,665

(22) Filed: Jun. 8, 2017

(65) Prior Publication Data

US 2018/0358476 A1      Dec. 13, 2018

(51) Int. Cl.
| | | |
|---|---|---|
| *H01L 27/24* | (2006.01) |
| *H01L 29/808* | (2006.01) |
| *H01L 29/10* | (2006.01) |
| *H01L 27/12* | (2006.01) |
| *H01L 29/06* | (2006.01) |
| *H01L 29/08* | (2006.01) |
| *H01L 29/66* | (2006.01) |
| *H01L 21/283* | (2006.01) |
| *H01L 21/8232* | (2006.01) |

(52) U.S. Cl.
CPC ........ *H01L 29/8083* (2013.01); *H01L 21/283* (2013.01); *H01L 21/8232* (2013.01); *H01L 27/1203* (2013.01); *H01L 29/0649* (2013.01); *H01L 29/0843* (2013.01); *H01L 29/1058* (2013.01); *H01L 29/66909* (2013.01)

(58) Field of Classification Search
None
See application file for complete search history.

(56) References Cited

U.S. PATENT DOCUMENTS

7,592,841 B2      9/2009 Kapoor

*Primary Examiner* — Long Pham
(74) *Attorney, Agent, or Firm* — Tutunjian & Bitetto, P.C.; Erik Johnson (57) ABSTRACT

A semiconductor device that is composed of an epitaxial semiconductor material stacked structure that includes a first epitaxial channel for a first junction field effect transistor (JFET) atop a supporting substrate and a second epitaxial channel region for a second junction field effect transistor (JFET). A commonly electrically contacted source/drain region for each of the first JFET and the second JFET is positioned at an interface of the first and second epitaxial channel region. A channel length for each of the first and second is substantially perpendicular to an upper surface of the supporting substrate. An epitaxial semiconductor gate conductor in direct contact with each of said first epitaxial channel region and the second epitaxial channel region.

9 Claims, 10 Drawing Sheets

FIG. 1C

| Vin1 | Vin2 | Vout |
|------|------|------|
| 0 | 0 | Vdd |
| Vdd | 0 | Vdd |
| 0 | Vdd | Vdd |
| Vdd | Vdd | 0 |

FOUR TERMINAL STACKED COMPLEMENTARY JUNCTION FIELD EFFECT TRANSISTORS

BACKGROUND

Technical Field

The methods and structures described herein relate to semiconductor devices, such as junction transistors.

Description of the Related Art

A Field Effect Transistor (FET) typically has a source, a channel, and a drain, where current flows from the source to the drain, and a gate that controls the flow of current through the channel. A junction field effect transistor (JFET) is a FET where the gate and the channel form a pn junction. A four terminal JFET is a JFET having two gates positioned on opposite sides of the channel region, with each gate forming a pn junction with the channel. With ever decreasing device dimensions, forming the individual electrical components is becoming more difficult to manufacture. Vertical transistors are one means of scaling transistors to decreasing dimensions.

SUMMARY

In one aspect, a semiconductor device including vertically orientated JFETs is provided. In one embodiment, the semiconductor device includes a semiconductor device that is composed of an epitaxial semiconductor material stacked structure that includes a first epitaxial channel for a first junction field effect transistor (JFET) atop a supporting substrate and a second epitaxial channel region for a second junction field effect transistor (JFET). A commonly electrically contacted source/drain region for each of the first JFET and the second JFET is positioned at an interface of the first and second epitaxial channel region. A channel length for each of the first and second JFET is substantially perpendicular to an upper surface of the supporting substrate. An epitaxial semiconductor gate conductor in direct contact with each of said first epitaxial channel region and the second epitaxial channel region.

In another embodiment, the semiconductor device including the vertically orientated JFETs may include an epitaxial semiconductor material stacked structure composed of a first epitaxial channel for a first four terminal junction field effect transistor region atop a supporting substrate and a second epitaxial channel region for a second four terminal junction field effect transistor. A commonly electrically contacted source/drain region for each of the first four terminal JFET and the second four terminal JFET is positioned at an interface of the first and second epitaxial channel region and provides the output node for each of the first and second four terminal JFETs. A channel length for each of the first and second four terminal JFET is substantially perpendicular to an upper surface of the supporting substrate. An epitaxial semiconductor gate conductor in direct contact with each of said first epitaxial channel region and said second epitaxial channel region.

In another aspect, a method is described that provides JFET devices in a stacked arrangement. In one embodiment, the method includes forming a trench through a multi-layered stack including first conductivity doped semiconductor material layer at a base of the trench. A semiconductor stacked structure is epitaxially formed in the trench, the semiconductor stacked structure including a first intrinsic channel on the first conductivity doped semiconductor material layer, a first conductivity doped source/drain region on the first intrinsic channel, a second conductivity doped source/drain region on the first conductivity doped source/drain region, and a second intrinsic channel. The multi-layered stack is recessed. A first gate conductor is formed in direct contact with the first intrinsic channel to provide a first JFET device. A second gate conductor is formed in direct contact with the second intrinsic channel to provide a second JFET device.

BRIEF DESCRIPTION OF THE DRAWINGS

The following description will provide details of preferred embodiments with reference to the following figures wherein.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

Vertical transistors, e.g., field effect transistors, are an attractive option for technology scaling for 5 nm and beyond. The methods and structures described herein are suitable for providing vertical junction field effect transistors (JFETs). A field effect transistor (FET) is a semiconductor device in which output current, i.e., source-drain current, is controlled by the voltage applied to a gate structure to the semiconductor device. A field effect transistor has three terminals, i.e., gate structure, source region and drain region. A "gate structure" means a structure used to control output current (i.e., flow of carriers in the channel) of a semiconducting device through electrical fields. As used herein, the term "channel" is the region underlying the gate structure and between the source and drain of a semiconductor device that becomes conductive when the semiconductor device is turned on. As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel.

A junction field effect transistor (JFET) does not include a gate dielectric layer in the gate structure of the device, which is a component of the gate structure to a metal oxide semiconductor field effect transistor (MOSFET). In a JFET, the gate and the channel form a pn junction. JFETs are voltage-controlled in that they do not need a biasing current. Electric charge flows through a semiconducting channel between source and drain terminals. By applying a reverse bias voltage to a gate terminal, the channel is "pinched", so that the electric current is impeded or switched off completely. In a regular JFET, having one gate, the channel is pinched from the gate side of the channel. In a four terminal JFET, having two gates, the channel is pinched from whichever side the gate is reverse biased, or from both sides if both gates are reverse biased. Compared to a JFET, having one gate, a four terminal JFET may be pinched off with a smaller gate voltage. Hence a four terminal JFET may be operated with a smaller power supply voltage than a regular JFET. A JFET is usually on when there is no potential difference between its gate and source terminals. If a potential difference of the proper polarity is applied between its gate and source terminals, the JFET will be more resistive to current flow, which means less current would flow in the channel between the source and drain terminals. Thus, JFETs are sometimes referred to as depletion-mode devices.

In some embodiments, junction field effect transistors (JFET) devices can have the benefits of low noise and high input impedance. Such properties can be beneficial for implementing operational amplifiers with high input-impedance and/or very high current-gain. Further, emerging mobile and internet of things (IoT) applications, as well as larger battery driven internet of thing (IoT) applications, can benefit from low power devices. Further, the devices described herein can be applicable for the analog implementation of neural networks that are highly beneficial for efficient/low-power implementation of cognitive tasks, such as pattern recognition and natural language processing.

JFETs may be used as low power switching devices for digital applications. Omission of the gate dielectric eliminates voltage drop across the gate dielectric that is exhibited in MOSFETs therefore keeping the required gate voltage to a minimum. Further, by employing JFETs, in which a gate dielectric is not present, the elimination of the gate dielectric allows for a near-ideal steep subthreshold characteristics without reliability issues that are associated with gate dielectrics that have been thinned to reach the subthreshold characteristics that are easily obtainable with JFET devices.

As will be described in greater detail below, the vertical 4-terminal JFETs that are described herein can improve device density and therefore increase logic-gate density. In some embodiments, the 4-terminal JFETs also enable a lower gate voltage, e.g., approximately 50% lower gate voltage, for a given driver current, or higher drive current, e.g., approximately two times higher drive current, for a same gate voltage. The methods and structures described herein can enable area-efficient and lower-power/low-voltage applications of junction FETs in digital and mixed-signal circuits including mobile and internet of things technologies. The methods and structures of the present disclosure are now described with greater detail with reference to FIGS. 1-13B.

FIG. 1 depicts one embodiment of a stacked 4-terminal JFET device structure. In one embodiment, a first JFET 100 of a first conductivity type is present on a supporting substrate 50, and a second JFET 200 of a second conductivity type is present atop the first JFET 100. The term "conductivity type" as used herein denotes a p-type conductivity or an n-type conductivity. In one example, the first JFET 100 having the first conductivity type is an n-type JFET having source and drain regions composed of a semiconductor material that is doped to be n-type, i.e., have majority carriers that are electrons. In one example, the second JFET 200 having the second conductivity type is a p-type JFET having source and drain regions composed of a semiconductor material that is doped to be p-type, i.e., have majority carriers that are holes.

FIG. 1 depicts one embodiment of a semiconductor device that includes an epitaxial semiconductor material stacked structure 35 comprising a first epitaxial channel 15 for the first junction field effect transistor 100 atop a supporting substrate 50 and a second epitaxial channel region 30 for a second junction field effect transistor 200, wherein a commonly electrically contacted source/drain region 20, 25 for each of the first JFET 100 and the second JFET 200 is positioned at an interface of the first and second epitaxial channel region 15, 30. The channel length L1 for each of the first and second is substantially perpendicular to an upper surface P1 of the supporting substrate 50. In some embodiments, an epitaxial semiconductor gate conductor 45, 55 is in direct contact with each of said first epitaxial channel region and said second epitaxial channel region.

In some embodiments, the width of the epitaxial semiconductor material stack structure 35 is entirely uniform extending from the second epitaxial channel region 30 portion of the second JFET 200 to the first epitaxial channel region 15 portion of the first JFET 100 across the interface including the commonly electrically contacted source/drain region 20, 25 for each of the first JFET 100 and the second JFET 200.

Still referring to FIG. 1, the semiconductor device further includes a first source/drain region for the first JFET 100 provided by a doped semiconductor layer 10 that is present atop an isolation structure 9 of the supporting substrate 50. In some embodiments, the semiconductor containing device further includes a second source/drain region 40 for the second JFET 200 provided by a doped semiconductor epitaxial semiconductor material that is formed on an end of the second epitaxial channel region 30 opposite an end of the channel region that the commonly electrically contacted source/drain region 25 for the second JFET 200 is present. The sidewalls for the first epitaxial channel region 15 are aligned with sidewalls of the commonly electrically contacted source/drain region 20, 25 for each of the first JFET 100 and the second JFET 200, and the sidewalls of the commonly electrically contacted source/drain region 20, 25 for each of the first JFET 100 and the second JFET 200 are aligned to sidewalls for the second epitaxial channel region 30. As will be described below, the alignment of the aforementioned sidewalls results from these structures all being formed within the same trench using an epitaxial growth process.

Figure 1A:
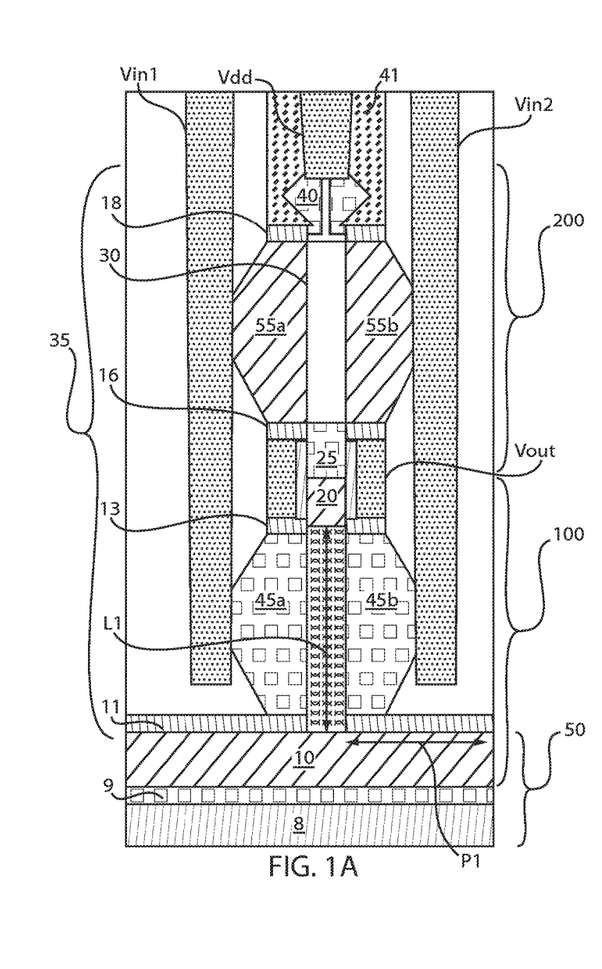
FIG. 1A is a side cross-sectional view of one embodiment of a 4-terminal junction field effect transistor (JFET), in accordance with the present disclosure.
Figure 1B:
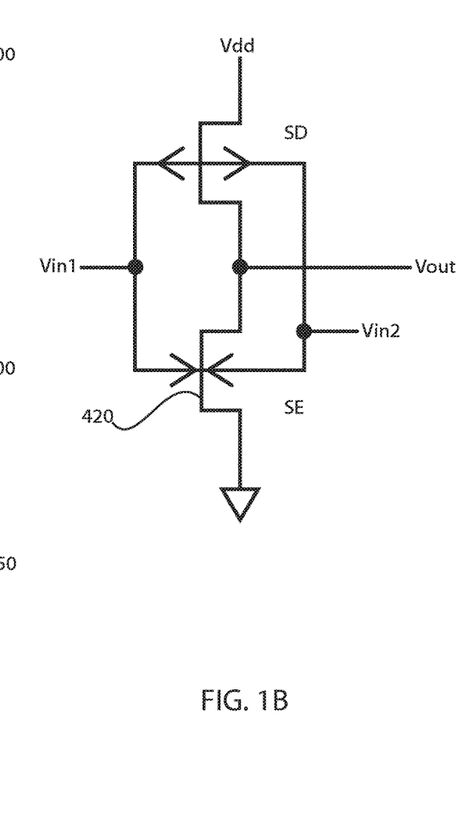
FIG. 1B is a circuit diagram corresponding to the 4-terminal junction field effect transistor (JFET) that is depicted in FIG. 1A.
Figure 1C:
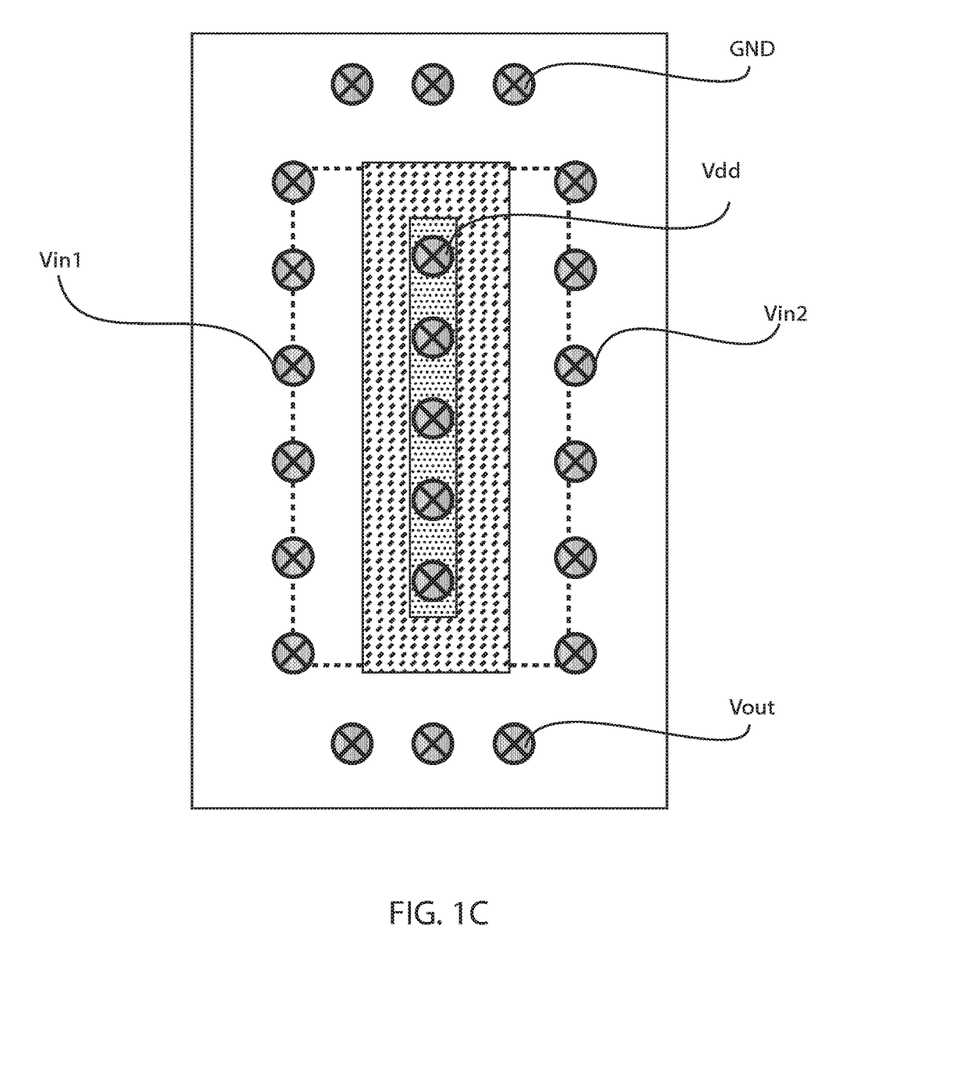
FIG. 1C is a top down view of the 4-terminal junction field effect transistor (JFET) that is depicted in FIG. 1A.

Referring to FIGS. 1A-1C, in some embodiments, a stacked 4-terminal (4T) JFET's logic circuit is provided that includes complementary 4T FET's, with a 4T p-type JFET 200 stacked on top of a 4T n-type JFET 100. The 4T p-type JFET has the source connected 40 to a power supply Vdd, the drain 25 connected to an output node Vout, the left gate conductor 55a connected to the first input node Vin1, and right gate conductor 55b connected to a second input node Vin2. The 4T n-type JFET 100 has the source connected to the ground terminal GND, the drain region 20 connected to the output node Vout, the left gate conductor 45a connected to a first input node Vin1, and a right gate conductor 45b connected to second input node Vin2. In some embodiments, the 4T n-type JFET 100 has the source connected to a low power supply level Vss. Output nodes Vout from the 4T p-type JFET 200 and the 4T n-type NFET 100 are connected due to the stacking architecture that positioned the 4T p-type JFET 200 directly atop the 4T n-type JFET 100.

Figure 2:
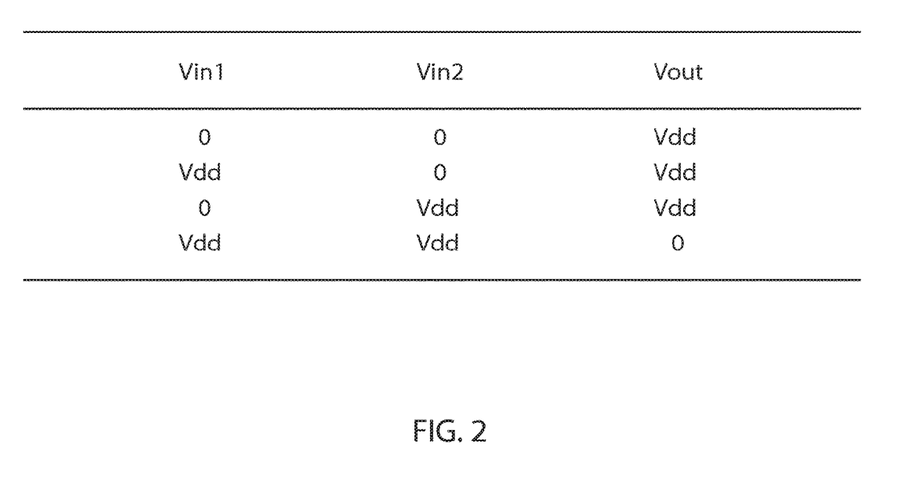
FIG. 2 is a table illustrating logic functioning of the 4-terminal junction field effect transistor (JFET) containing structure depicted in FIGS. 1A-1C.

Logic levels provided to and output from the stacked 4-terminal JFET's logic circuit can be power supply voltage Vdd for a logic one, and a logic zero can be essentially ground or 0 volts, or Vss if the 4T n-type JFET 100 has the source connected to a low power supply level Vss. The circuit works according to the table depicted in FIG. 2. Resulting from this table it is clear, the stacked 4-terminal JFET's logic circuit provides a logic function of an inverter with respect to one signal (by maintaining the other signal at a constant level). However, the same stacked 4-terminal JFET's logic circuit also functions as a NAND gate. This is in sharp contrast to a complementary metal-oxide-semiconductor (CMOS) NOR gate that can require four transistors (two n-channel MOSFETs and two p-channel MOSFETs). In this way, using complementary 4-terminal JFET devices, our stacked 4-terminal JFET's logic circuit that is described herein can provide an equivalent function with fewer transistors than a CMOS implementation. In this way, the size of an integrated circuit can be reduced over conventional CMOS approaches.

The 4-terminal JFET devices 100, 200 that are disclosed herein may be used in analog applications such as modulation, demodulation and amplification leveraging the second gate terminal for signal mixing. Amplitude modulation is performed using a circuit such as the Gilbert cell, which typically requires several transistors. The 4-terminal JFET therefore reduces area consumption for the implementation of this circuit. A vertical 4-terminal JFET (as disclosed herein) further improves device density and therefore area consumption. It also enables lower (~50%) gate voltage for given drive current, or higher drive current (~2×) for the same gate voltage. In some embodiments, the 4-terminal JFET devices may be used in analog applications such as modulation, demodulation and amplification leveraging the second gate terminal for signal mixing.

Figure 3:
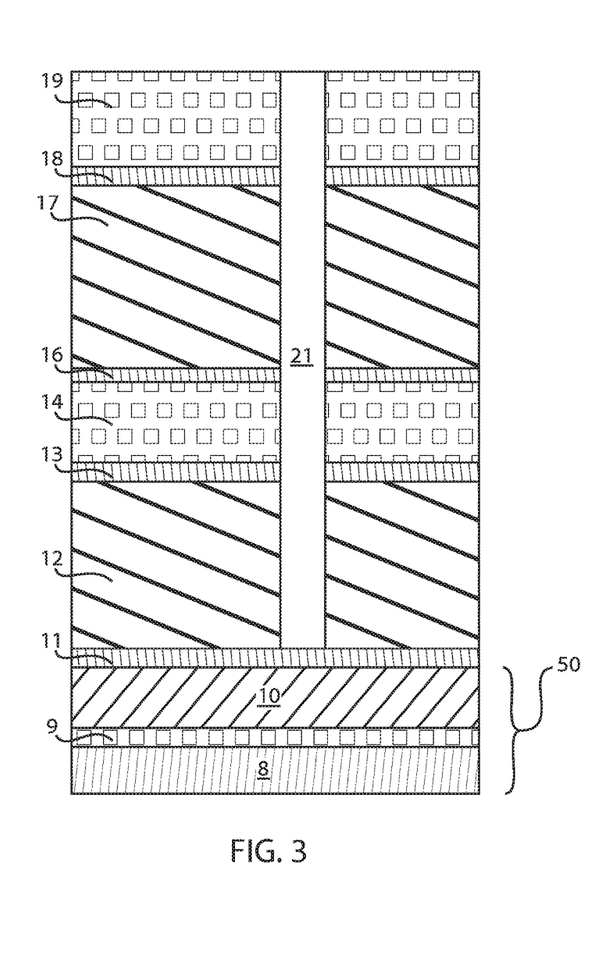
FIG. 3 is a side cross-sectional view of a forming a trench into a material stack for forming a 4-terminal junction field effect transistor (JFET), in which the trench extends through two sacrificial gate layers and terminates on a dielectric spacer layer that is overlying a doped semiconductor region that provides a source/drain region for the JFET, in accordance with one embodiment of the present disclosure.

FIGS. 3-14B depict one embodiment of a method for forming the stacked 4T JFET structure depicted in FIGS. 1A-1C. FIG. 3 depicts one embodiment of a material stack formed atop a supporting substrate 50 that includes a doped semiconductor layer 10, a counter doped semiconductor layer 9 and a base substrate 8 for providing the vertically orientated JFETS 100, 200. The base substrate 8 may be composed of silicon (Si), but other type IV and type III-V semiconductor materials may also provide the base substrate 8. The counter doped semiconductor layer 9 is also composed of a semiconductor material, such as a type IV semiconductor, e.g., silicon, or a type III-V semiconductor, such as gallium arsenic (GaAs). The conductivity type of the counter doped semiconductor layer 9 is opposite the conductivity type of the overlying doped semiconductor layer 10, which provides a source/drain region to the first JFET 100, i.e., lower JFET. For example, when the first JFET 100 is an n-type device, the doped semiconductor layer 10 is n-type, while the counter doped semiconductor layer 9 is p-type. The counter doped layer 9 may be formed on the upper surface of the base substrate 8 by ion implantation into the upper surface of the base substrate 8 or by epitaxial growth in combination with in situ doping or ion implantation.

As noted above, the doped semiconductor layer 10 provides a source/drain region for the JFET 100. The doped semiconductor layer 10 may be a type IV semiconductor material layer, such as silicon (Si), or the doped semiconductor layer 10 may be a type III-V semiconductor material layer, such as gallium arsenic (GaAs). Further, as noted above, the doped semiconductor layer 10 is doped with a conductivity type dopant consistent with the conductivity of JFET 100. For example, if the JFET 100 is an n-type JFET 100, the doped semiconductor layer 10 is doped to an n-type conductivity. The doped semiconductor layer 10 may have a thickness ranging from 5 nm to 50 nm.

It is noted that the supporting substrate 50 may also be provided by a semiconductor on insulator (SOI) substrate. In this example, the upper semiconductor layer of the SOI substrate, e.g., a silicon layer, may provide the doped semiconductor layer 10; and the buried insulating layer, e.g., silicon oxide ($SiO_2$), of the SOI substrate can be substituted for the counter doped semiconductor layer 9 to provide an isolating function. The base semiconductor layer of the SOI substrate can provide the base semiconductor layer 8.

Referring to FIG. 3, in some embodiments, the material stack may further include a first dielectric spacer layer 11, a first sacrificial gate structure layer 12, a second dielectric spacer layer 13, a dielectric source/drain spacer layer 14, a third dielectric spacer layer 16, a second sacrificial gate structure layer 17, a fourth dielectric spacer layer 18, and a dielectric cap layer 19. The first and second sacrificial gate structure layers 12, 17 may be composed of a semiconductor material, such as silicon (Si), e.g., amorphous silicon (a-Si).

The spacer layers, e.g., the first dielectric space layer 11, the second dielectric spacer layer 13, the third dielectric spacer layer 16, and the fourth dielectric spacer layer 18, can be composed of a nitride, such as silicon nitride. In some embodiments, the dielectric source/drain spacer layer 14 and the dielectric cap layer 10 are composed of an oxide, such as a silicon oxide ($SiO_2$). The thickness of each of the aforementioned dielectric spacer layers may range from 5 nm to 20 nm.

Each of the aforementioned layers, i.e., semiconductor and dielectric layers, may be formed using a deposition process, such as chemical vapor deposition (CVD), plasma enhanced chemical vapor deposition (PECVD), metal organic chemical vapor deposition (MOCVD), room temperature chemical vapor deposition (RTCVD), high density plasma chemical vapor deposition (HDPCVD) and combinations thereof.

FIG. 3 also depicts forming a trench 21 through the above described material stack. The trench 21 can be formed using deposition, photolithography and etch processes. First, an etch mask is formed atop the material stack having openings exposing the portions of the material stack, in which the trench 21 is formed. Specifically, a etch mask can be produced by applying a photoresist to the surface to be etched; exposing the photoresist to a pattern of radiation; and then developing the pattern into the photoresist utilizing conventional resist developer to produce the etch mask. Once the patterning of the photoresist is completed, the sections covered of the material stack covered by the etch mask are protected while the exposed regions are removed using an etching process that removes the unprotected regions. In some embodiments, the etch process may be an anisotropic etch that removes the exposed portions of the dielectric cap layer 19, the fourth dielectric spacer layer 18, the second sacrificial gate structure layer 17, the third dielectric spacer layer 16, the dielectric source/drain spacer layer 14, the second dielectric spacer layer 13, and the first sacrificial gate structure layer 12 terminating on the first dielectric spacer layer 11.

Figure 4:
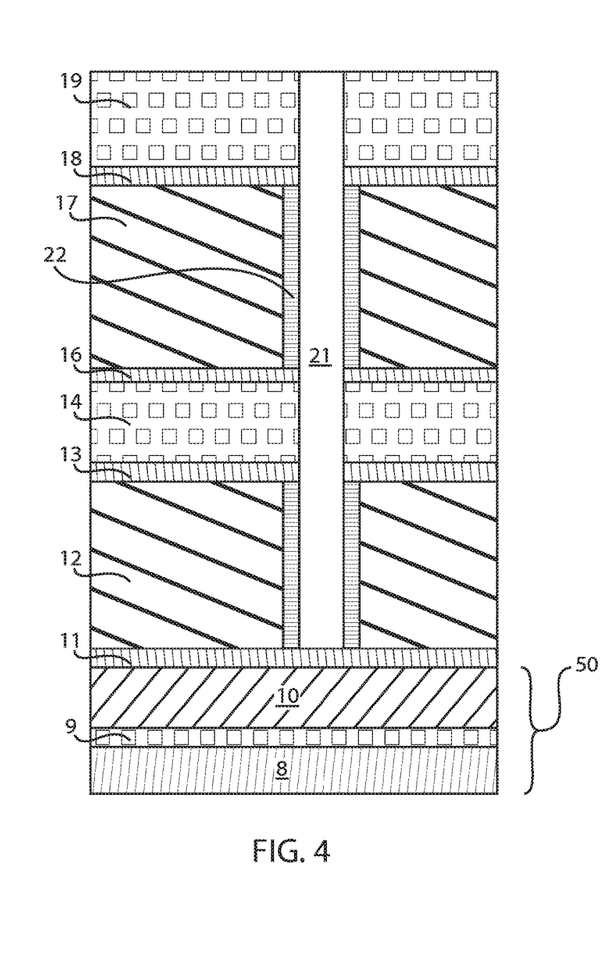
FIG. 4 is a side cross-sectional view of forming a dielectric surface on the exposed trench sidewall surface of the two sacrificial gate layers, and opening the dielectric spacer layer to expose the doped semiconductor region at the base of the trench.

FIG. 4 depicts one embodiment of forming a dielectric surface 22 on the exposed trench sidewall surface of the two sacrificial gate layers 12, 17, and opening the first dielectric spacer layer 11 to expose the doped semiconductor layer 10 at the base of the trench 21. In some embodiments, a thermal oxidation process forms a dielectric surface 22 of the sidewall surface of the sacrificial gate conductor layers 12, 17 that are exposed within the trench 21. In the embodiments in which the sacrificial gate structure layer 12, 17 is composed of a silicon containing material, the dielectric surface 22 may be composed of an oxide, such as silicon oxide.

The exposed portion of the first dielectric spacer layer 11 at the base of the trench 19 may than be removed to expose the underlying doped semiconductor layer 10 using an etch process, such as a wet chemical etch, plasma etch or reactive ion etching (RIE). The etch process for removing the exposed portion of the first dielectric spacer layer 11 may be selective to the underlying doped semiconductor layer 10.

Figure 5:
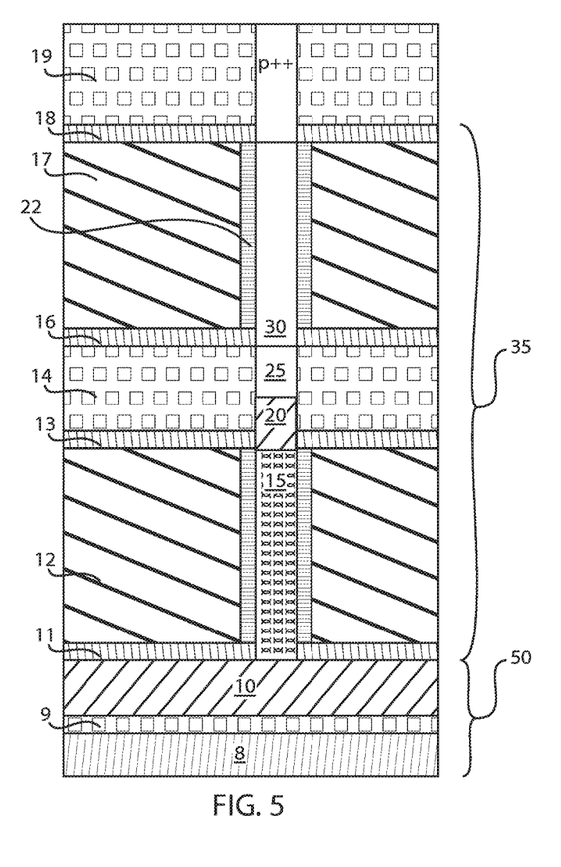
FIG. 5 is a side cross-sectional view of epitaxially forming semiconductor material in the trench through the material stack, the epitaxial semiconductor material including the channel regions for the stacked JFET devices, in accordance with one embodiment of the present disclosure.

In a following process step, the epitaxial semiconductor material stacked structure 35 is formed filling the trench using an epitaxial deposition process that employs the exposed surface of the doped semiconductor layer 10 at the base of the trench as an epitaxial deposition growth surface. The epitaxial semiconductor material stacked structure 35 includes the first epitaxial channel 15 for a first junction field effect transistor (JFET) 100 atop a supporting substrate 50 and a second epitaxial channel region 30 for a second junction field effect transistor (JFET) 200. The epitaxial semiconductor material stacked structure 35 may also include a commonly electrically contacted source/drain region 20, 25 for each of the first JFET 100 and the second JFET 200, which is positioned at an interface of the first and second epitaxial channel region 15, 30.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. A material that is "epitaxial" is a material that has been formed using an epitaxial deposition process.

The epitaxial semiconductor material stacked structure 35 can be a type IV semiconductor containing material layer. For example, the epitaxial semiconductor material stacked structure 35, i.e., each of the first epitaxial channel 15, the commonly electrically contacted source/drain region 20, 25, and the second epitaxial channel 30, may be composed of silicon (Si), germanium (Ge), silicon germanium (SiGe) and other semiconductor materials. The epitaxial deposition process may employ the deposition chamber of a chemical vapor deposition type apparatus, such as a PECVD apparatus. In some embodiments, the gas source for the epitaxial deposition of the epitaxial semiconductor material stacked structure 35 may include silicon (Si) deposited from silane, disilane, trisilane, tetrasilane, hexachlorodisilane, tetrachlorosilane, dichlorosilane, trichlorosilane, disilane and combinations thereof. The temperature for epitaxial silicon germanium deposition typically ranges from 450° C. to 900° C. Although higher temperature typically results in faster deposition, the faster deposition may result in crystal defects and film cracking. In other embodiments, the epitaxial semiconductor material stacked structure 35 may be composed of a type III-V semiconductor material. The epitaxial semiconductor material that provides the epitaxial semiconductor material stacked structure 35 does not form on dielectric surfaces, such as the dielectric cap layer 18 or the dielectric surfaces 22 of the sacrificial gate structure layers 12, 17.

In some embodiments, the epitaxial semiconductor material for the epitaxial semiconductor material stacked structure 35 may be formed using a low temperature epitaxial growth process. The term "low temperature" when used to describe the epitaxial deposition process denotes that the maximum temperature of the epitaxial deposition process for forming the epitaxial semiconductor material, such as the second source/drain region 25b, is 350° C.

The structures depicted being formed in FIG. 4 may be described as the epitaxial growth of the complementary Junction FET channel structure, which can be followed by chemical mechanical planarization (CMP) of the upper structure to remove possible epitaxial overgrowth. The epitaxial growth process may be timed to provide the separate regions for the first epitaxial channel 15, the commonly electrically contacted source/drain region 20, 25, and the second epitaxial channel 30. For example, the first epitaxial channel 15 may not be doped to provide an undoped, i.e., intrinsic, channel for the JFET 100.

Following a first time period for forming the first epitaxial channel 15, the process conditions of the epitaxial deposition process may be changed to provide the source/drain region 20 for the JFET 100, which is a portion of the commonly electrically contacted source/drain region 20, 25. In one embodiment, the source/drain region 20 for the JFET 100 is doped to an n-type conductivity, which is consistent with the n-type conductivity doped semiconductor layer 10 that provides the opposing source/drain region for the JFET 100, which can be an n-type JFET 100. The source/drain region 20 for the JFET 100 may be in-situ doped to provide the n-type conductivity. In one example, the n-type conductivity is provided by phosphorus, which is an n-type dopant. The term "in situ" denotes that the dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gases. In one embodiment, the n-type gas dopant source may include arsine ($AsH_3$), and phosphine ($PH_3$). The lower source/drain region 25 of the JFET 200 may be formed in direct contact with the upper source/drain region 20 of the JFET 100, and can have an opposite conductivity type as the upper source/drain region 20 of the JFET 100. For example, if the lower JFET is an n-type device having an upper source/drain region 20 that is doped to an n-type conductivity, the lower source/drain region 25 of the JFET 200 is doped to a p-type conductivity. The lower source/drain region 25 of the JFET 200 can be formed using an epitaxial growth process employing in situ doping. The p-type dopant that provided the p-type conductivity for the lower source/drain region 25 of the JFET 200 may be boron. The p-type gas dopant source may include diborane ($B_2H_6$). The lower source/drain region 25 of the JFET 200 provides the second part of the commonly electrically contacted source/drain region 20, 25. Following the formation of the lower source/drain region 25, the second epitaxial channel region 30 may be epitaxially formed in which the time period of epitaxial growth for the second epitaxial channel region 30 may be selected to fill a remainder of the trench 21.

Figure 6:
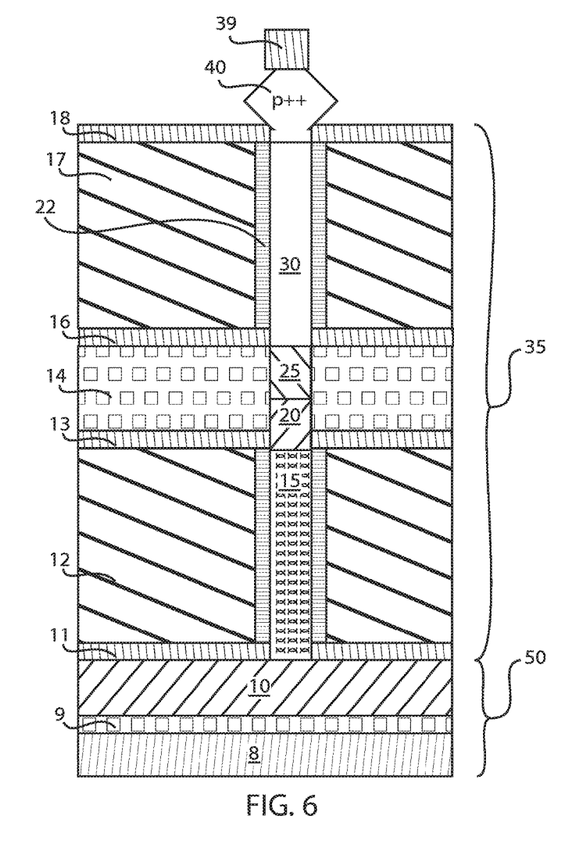
FIG. 6 is a side cross-sectional view of forming a source/drain region on an upper surface of the stack of epitaxial semiconductor material for the stacked JFET devices, in accordance with one embodiment of the present disclosure.

FIG. 6 depicts one forming a source/drain region 40 on an upper surface of the stack of epitaxial semiconductor material 35 for the stacked JFET devices 100, 200. Forming the source/drain region 40, i.e., upper source/drain region, for the JFET 200 can include recessing the upper surface of the stacked epitaxial semiconductor material 35, and forming a dielectric cap 39 on the recessed surfaces of the stacked epitaxial semiconductor material 35. The stacked epitaxial semiconductor material 35 may be recessed using an etch that is selective to the dielectric cap layer 19. The term "selective" denotes that a first material may be etched at a faster rate to a second material. For example, the selective etch rate may remove a first material at a rate greater than 20:1, e.g., greater than 100:1, in comparison to a second material.

The recess is filled with a deposited dielectric material to provide the dielectric cap layer 19. In some embodiments, the dielectric cap layer 19 may be composed of a nitride, such as silicon nitride, that is deposited using chemical vapor deposition (CVD), such as plasma enhanced chemical vapor deposition (PECVD).

FIG. 6 depicts one embodiment of forming the upper source/drain region 40 of the JFET 200 device. In some embodiments, forming the upper source/drain region 40 may begin with removing the cap dielectric layer 19 with an etch process, such as an etch process that is selective to the fourth dielectric spacer layer 18. Removing the cap dielectric layer 19 exposes upper sidewalls of the portion of the stacked epitaxial semiconductor material 35 that is to be processed to provide the upper source/drain region of the JFET 200.

FIG. 6 depicts one embodiment of epitaxially forming the epitaxial semiconductor material for the second source/drain region 40 directly on the exposed upper sidewall surfaces of the stacked epitaxial semiconductor material 35, in which the epitaxial semiconductor material has a diamond geometry. The diamond like geometry of the epitaxial semiconductor material for the source/drain regions 40 depicted in FIG. 6 have a peaked sidewall or a sidewall having a first apex on each sidewall of the epitaxial semiconductor material.

In some embodiments, the epitaxial semiconductor material for the source/drain region 40 may be composed of silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors. The epitaxial semiconductor material for the source/drain region 40 is grown using an epitaxial growth or deposition process that may be a selective deposition process. For example, although the epitaxially semiconductor material for the source/drain region 40 orientates to the crystal arrangement of a semiconductor material, the material may not be deposited on the dielectric material of the dielectric cap 39.

The epitaxial deposition process described above for forming the epitaxial semiconductor material stacked structure 35 is suitable for providing more details for the epitaxial deposition process for forming the epitaxial semiconductor material for the source/drain region 40, such as gas precursors and deposition temperatures. In one embodiment, the epitaxial semiconductor material for the source/drain region 40 is composed of silicon that is p-type doped, e.g., monocrystalline silicon that is p-type doped.

Figure 7:
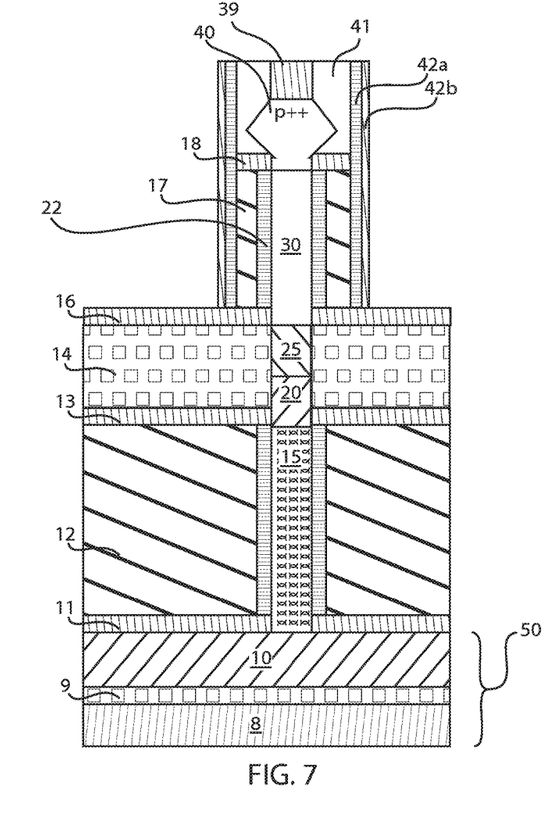
FIG. 7 is a side cross-sectional view depicting forming a first sidewall spacer on the source/drain region that is present on the upper surface of the stack of epitaxial semiconductor material that has been formed in the trench, etching a second sacrificial gate layer using the sidewall spacer as an etch mask, and forming at least a second sidewall spacer on a remaining portion of the second sacrificial gate layer, in accordance with one embodiment of the present disclosure.

FIG. 7 depicts one embodiment of forming a first sidewall spacer 41 on the source/drain region 40 that is present on the upper surface of the stack of epitaxial semiconductor material 35 that has been formed in the trench. The first sidewall spacer 41 covers the diamond spaced epitaxial material of the source/drain regions 40. The first sidewall spacers 41 are formed using a conformal deposition process, such as plasma enhanced chemical vapor deposition (PECVD), following by an anisotropic etchback process, such as reactive ion etch.

FIG. 7 also depicts one embodiment of etching the second sacrificial gate layer 17 using the first sidewall spacer 41 as an etch mask. The dielectric cap layer 39 may also function as an etch mask during this process step. The etch process for removing a majority of the fourth dielectric spacer layer 18 and the sacrificial gate structured layer 17 may be selective to the third dielectric spacer layer 16. In some embodiments, an anisotropic etch, such as reactive ion etch (RIE), removes a majority of the fourth dielectric spacer layer 18 and the sacrificial gate structured layer 17. Due to the anisotropic nature of the etch process, a remaining portion of the fourth dielectric spacer layer 18 and the sacrificial gate structured layer 17 are present underlying the first sidewall spacers 41.

FIG. 7 also depicts one embodiment of forming second sidewall spacers 42a, 42b on the sidewall of the remaining portions of the first sacrificial gate structure 17. The second sidewall spacers 42a, 42b may be a dual spacer. The dual spacer may include an interior oxide sidewall spacer 42a and an exterior nitride sidewall spacer 42b. In one example, the exterior nitride sidewall spacer 42 may be composed of silicon nitride, and the interior oxide sidewall spacer 42a may be composed of silicon oxide. The second sidewall spacers 42a, 42b are formed using a conformal deposition process, such as plasma enhanced chemical vapor deposition (PECVD), following by an anisotropic etchback process, such as reactive ion etch.

Figure 8:
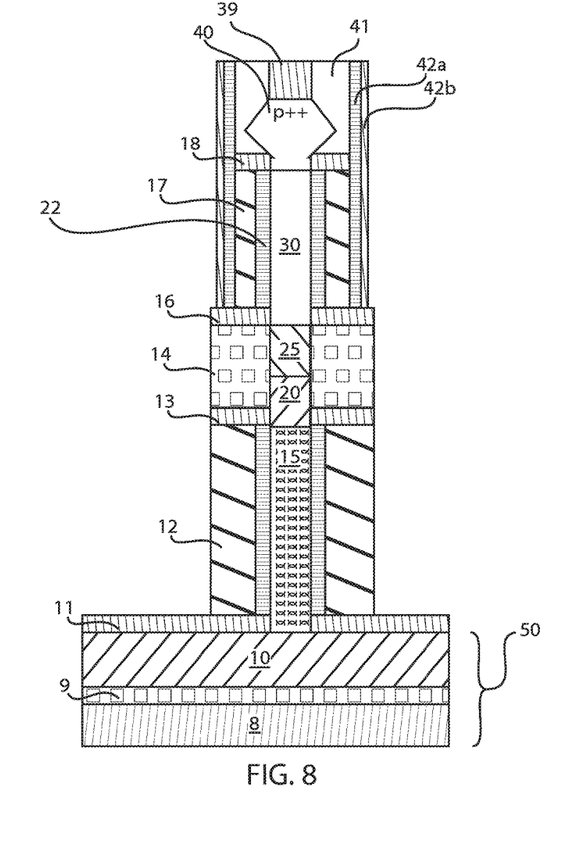
FIG. 8 is a side cross-sectional view depicting etching the first sacrificial gate layer using the first sidewall spacer and the second sidewall spacer at an etch mask, wherein the etch terminates on a spacer dielectric layer present atop the doped semiconductor region that provides a source/drain region for the JFET.

FIG. 8 depicts etching the first sacrificial gate layer 12 using the second sidewall spacers 42a, 42b, the first sidewall spacer 41 and the dielectric cap 39 as an etch mask. The etch process for removing a majority of the third dielectric spacer layer 18 and the sacrificial gate structured layer 17 may be selective to the third dielectric spacer layer 16. In some embodiments, an anisotropic etch, such as reactive ion etch (RIE), removes a majority of the fourth dielectric spacer layer 18 and the sacrificial gate structured layer 17. In one embodiment, the etch terminates on a first dielectric spacer layer 11 present atop the doped semiconductor layer 10 that provides a source/drain region for the JFET 100. Because of the anisotropic nature of the etch process, a remaining portion of the third dielectric spacer layer 16, the dielectric source/drain spacer layer 14, the second dielectric spacer layer 13 and the second sacrificial gate structure layer 17 is present underlying the second sidewall spacers 42a, 42b and the first sidewall spacers 41.

Figure 9:
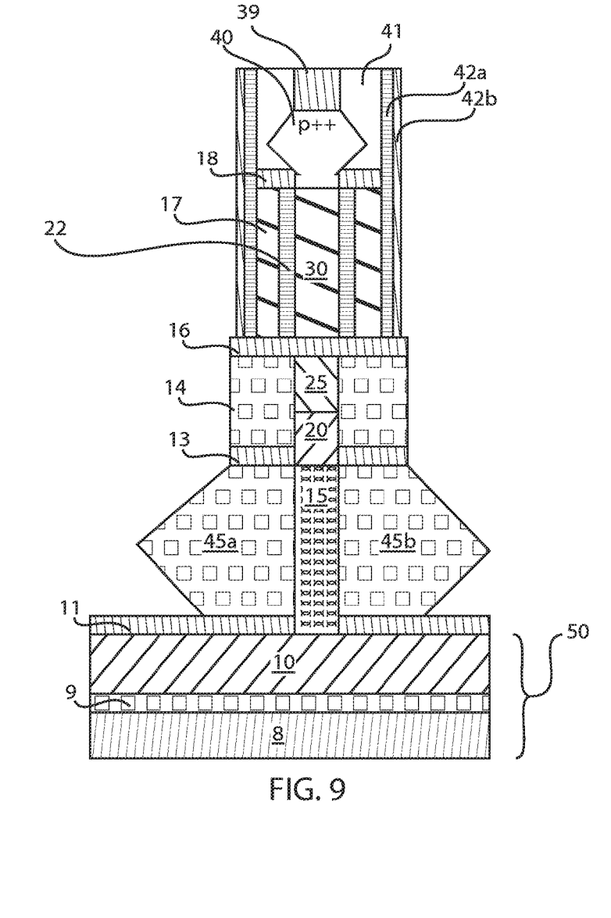
FIG. 9 is a side cross-sectional view depicting epitaxially forming a first gate structure directly on the channel of a first JFET, in accordance with one embodiment of the present disclosure.

FIG. 9 depicts one embodiment of epitaxially forming a first gate structure 45a, 45b directly on the first epitaxial channel 15 of the first JFET 10. Forming the first gate structure 45a, 45b may begin with removing the remaining portion of the second sacrificial gate structure layer 17. The remaining portion of the second sacrificial gate structure 17 may be removed using an isotropic etch, such as a wet chemical etch or a plasma etch. The term "isotropic" means non-directional. The etch process for removing the second sacrificial gate structure 17 may be selective to the dielectric cap 19, the first sidewall spacer 41 and the second sidewall spacers 42a, 42b. The etch process can also be selective to the first dielectric spacer layer 11, the dielectric source/drain spacer layer 14, and the second dielectric spacer layer 13. In some embodiments, the etch process, which can include more than one etch chemistry for different etch selectivity, can remove the second sacrificial gate structure 17 selectively to the dielectric surface 22. Thereafter, the dielectric surface 22 can be removed selectively to the epitaxial semiconductor material stacked structure 35.

Removing the dielectric surface 22 exposes the semiconductor material surface of the first epitaxial channel 15. The exposed semiconductor material surface provides an epitaxial growth surface for the first gate structure 45a, 45b. The first gate structure 45a, 45b is composed of an epitaxial semiconductor material that is in situ doped to provide electrical conductivity for providing a gate conductor. The epitaxial semiconductor material that provides the first gate structure 45a, 45b is in direct contact with the first epitaxial channel 15 providing the gate conductor is in direct contact with the first epitaxial channel 15 without a gate dielectric (or any other dielectric layer) present therebetween, which provides a JFET 100.

As depicted in FIG. 9, the first gate structure 45a, 45b can be epitaxially formed having a diamond shaped geometry similar to the upper source/drain region 40 of the JFET 200. Therefore, further details for the epitaxial deposition/growth process for forming the first gate structure 45a, 45b have been described above with reference to the method steps for forming the upper source/drain region 40 and the epitaxial semiconductor material stacked structure 35. In some embodiments, the first gate structure 45a, 45b may be composed of silicon (Si), but the first gate structure 45a, 45b may also be composed of other type IV and/or type III-IV semiconductor materials. In some examples, the first gate structure 45a, 45b is doped to an n-type conductivity.

In some embodiments, because the channel surface has <110> planes, a diamond shaped structure will form (bound by <111> planes) for the first gate structure 45a, 45b. The fin, i.e., epitaxial semiconductor material stacked structure 35, ends are protected by nitride or "CMOS dummy gates" to separate the left and right epitaxial gate structure 45a, 45b. In another embodiment, the fin ends can be removed off by RIE (using appropriate masking) to disconnect the left and right gate epitaxy 45a, 45b.

Figure 10:
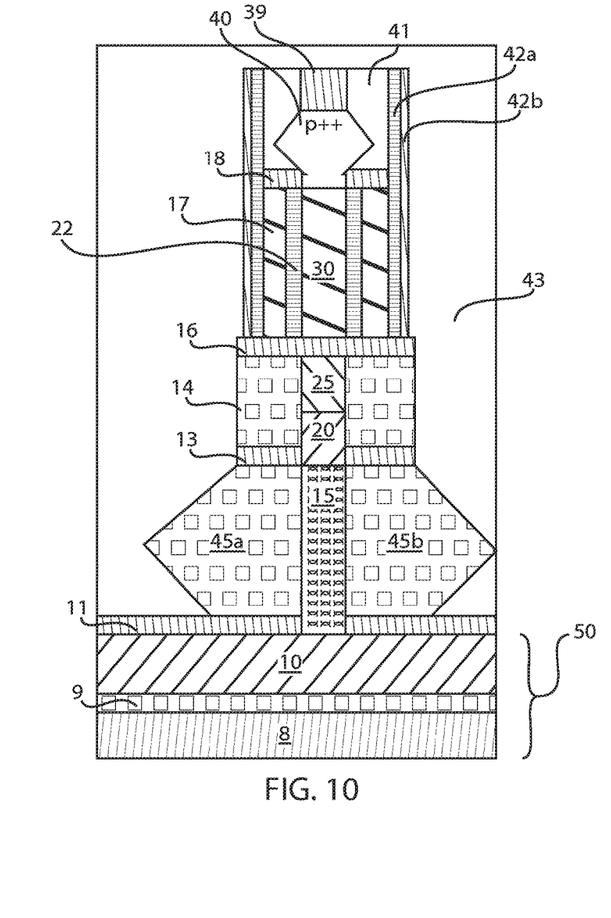
FIG. 10 is a side cross-sectional view depicting depositing an interlevel dielectric layer on the first gate structure depicted in FIG. 9, in accordance with one embodiment of the present disclosure.

FIG. 10 depicts depositing an interlevel dielectric layer 43 on the first gate structure depicted in FIG. 9. The interlevel dielectric layer 43 may be composed of any dielectric material, such as an oxide, nitride or oyxnitride material. For example, the interlevel dielectric layer 43 may be composed of any dielectric material used in microelectronic and nanoelectronic structures, which can include $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The interlevel dielectric layer 43 may be deposited using chemical vapor deposition, deposition from solution, spin on deposition and combinations thereof. Following deposition, a planarization process may be applied to the upper surface of the interlevel dielectric layer 43.

Figure 11:
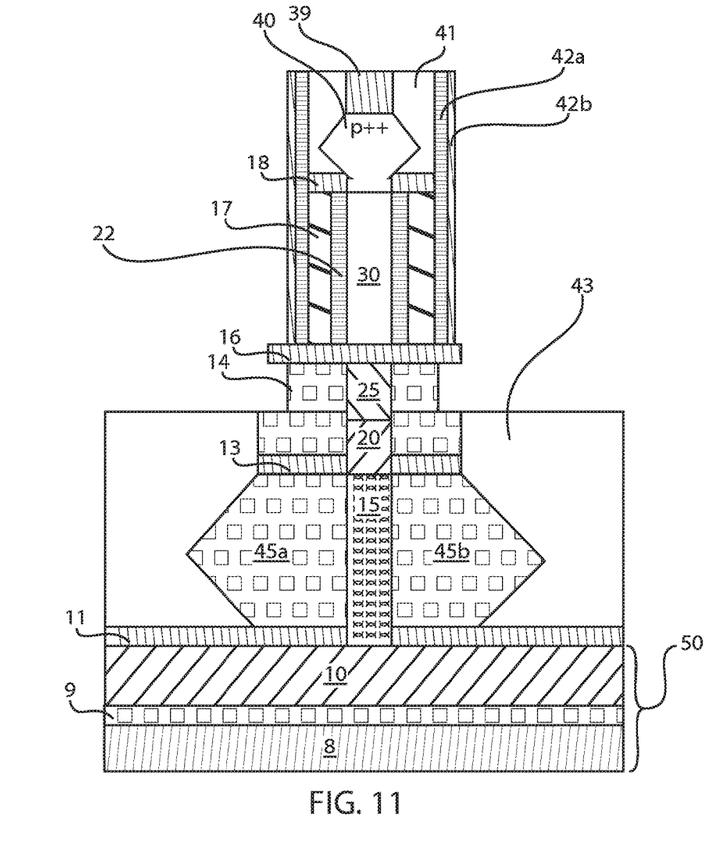
FIG. 11 is a side cross-sectional view depicting recessing the interlevel dielectric layer and removing the at least one second sidewall spacer, in accordance with one embodiment of the present disclosure.

FIG. 11 depicts recessing the interlevel dielectric layer 43 and removing the at least one second sidewall spacer 42a, 42b. The interlevel dielectric layer 43 is recessed to a depth that is below the second sacrificial gate structure 17. The interlevel dielectric layer 43 may be recessed by an anisotropic etch, such as reactive ion etch (RIE). Once the interlevel dielectric layer 43 has been recessed, the second sidewall spacer 42a, 42b may be removed. The second sidewall spacer 42a, 42b may be removed by an isotropic etch that is selective to the first spacer 41, which protects the source/drain region 40. Thereafter, the second sacrificial gate structure layer 17 may be removed using a selective etch process, which may be an isotropic etch, such as gas etching, plasma etching and/or wet chemical etching. In a following step, the dielectric surface 22 can be removed selectively to the epitaxial semiconductor material stacked structure 35.

Figure 12:
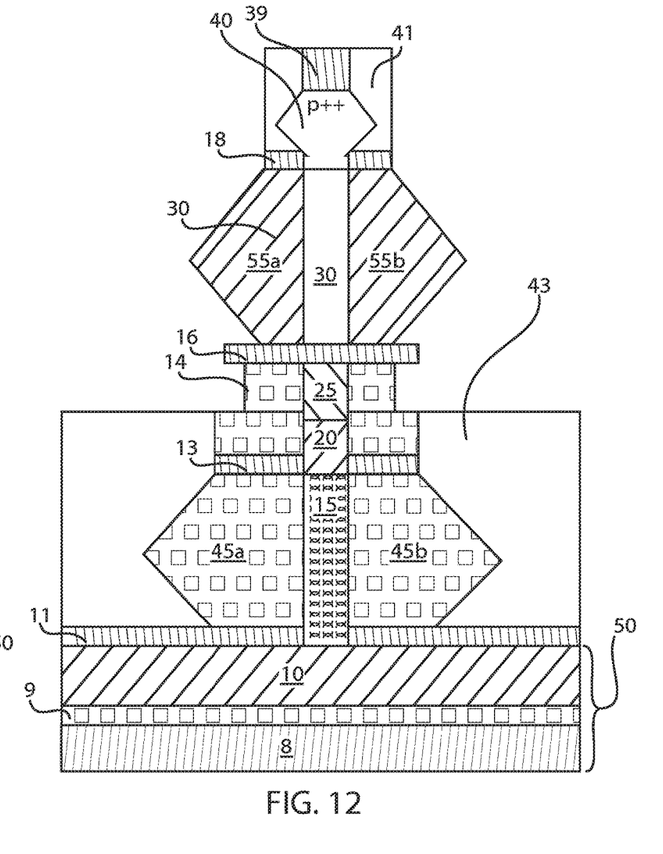
FIG. 12 is a side cross-sectional view depicting forming a second gate structure directly on the channel of a second JFET, in accordance with one embodiment of the present disclosure.

Removing the dielectric surface 22 exposes the semiconductor material surface of the first epitaxial channel 15. The exposed semiconductor material surface provides an epitaxial growth surface for the second gate structure 55a, 55b, as depicted in FIG. 12. The second gate structure 55a, 55b is composed of an epitaxial semiconductor material that is in situ doped to provide electrical conductivity for providing a gate conductor. The epitaxial semiconductor material that provides the second gate structure 55a, 55b is in direct contact with the second epitaxial channel 30 providing the gate conductor is in direct contact with the second epitaxial channel 30 without a gate dielectric (or any other dielectric layer) present therebetween, which provides a JFET 200.

As depicted in FIG. 12, the second gate structure 55a, 55b can be epitaxially formed having a diamond shaped geometry similar to the upper source/drain region 40 of the JFET 200. Therefore, further details for the epitaxial deposition/growth process for forming the second gate structure 55a, 55b have been described above with reference to the method steps for forming the upper source/drain region 40 and the epitaxial semiconductor material stacked structure 35. In some embodiments, the second gate structure 55a, 55b may be composed of silicon (Si), but the second gate structure 55a, 55b may also be composed of other type IV and/or type III-IV semiconductor materials. In some examples, the second gate structure 55a, 55b is doped to an n-type conductivity.

In some embodiments, because the channel surface has <110> planes, a diamond shaped structure will form (bound by <111> planes) for the second gate structure 55a, 55b. The fin, i.e., epitaxial semiconductor material stacked structure 35, ends are protected by nitride or "CMOS dummy gates" to separate the left and right epitaxial gate structure 55a, 55b. In another embodiment, the fin ends can be removed off by RIE (using appropriate masking) to disconnect the left and right gate epitaxy 55a, 55b.

Figure 13:
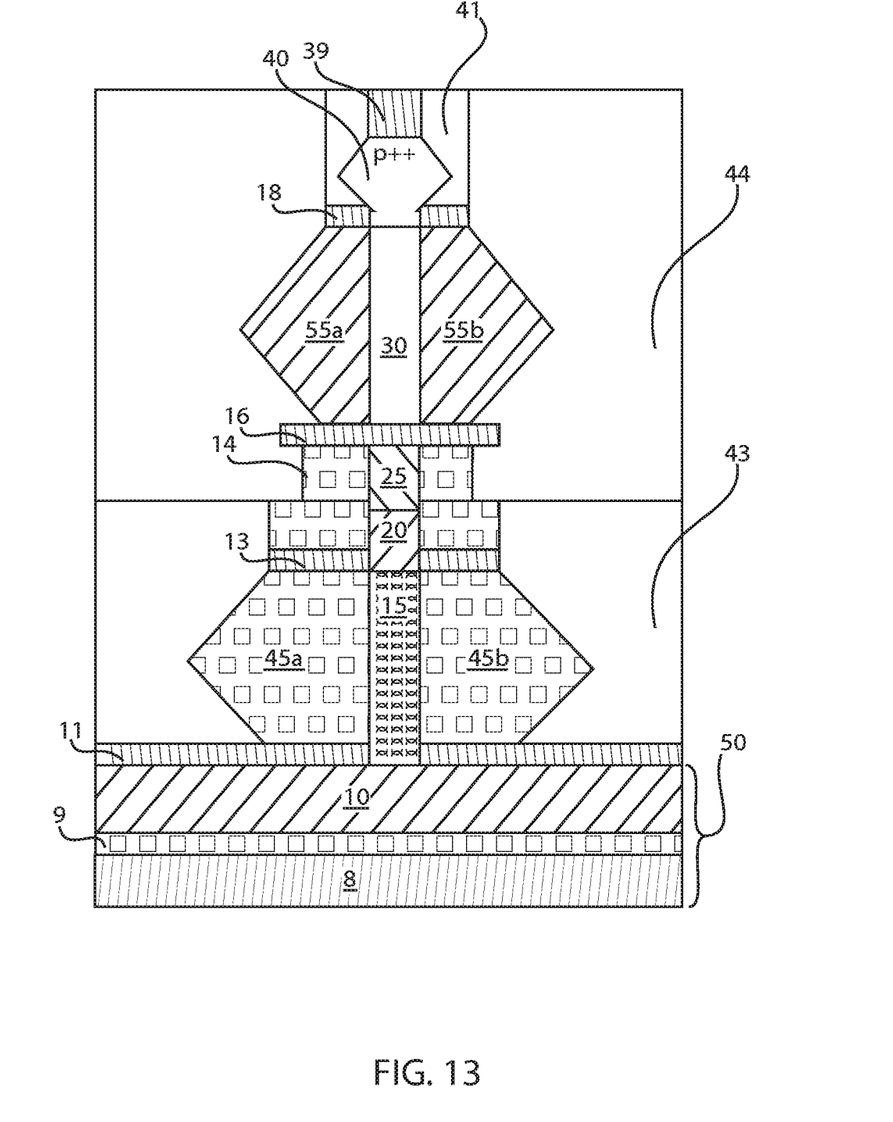
FIG. 13 is a side cross-sectional view depicting depositing an interlevel dielectric layer on the second gate structure depicted in FIG. 12, in accordance with one embodiment of the present disclosure.

FIG. 13 depicts one embodiment of depositing an interlevel dielectric layer 44 on the second gate structure 55a, 55b depicted in FIG. 12. The interlevel dielectric layer 44 that is depicted in FIG. 13 is similar to the interlevel dielectric layer 43 that is described with reference to FIG. 10. Therefore, the description of the interlevel dielectric layer 43 described in FIG. 10 is suitable for describing one embodiment of the interlevel dielectric layer 44 that is depicted in FIG. 13.

FIGS. 1A-1C, 14A and 14B depict forming contacts to the devices, i.e., JFET 100, JFET 200 depicted in FIG. 13. In some embodiments, the contacts are formed by forming vias, i.e., openings, through the interlevel dielectric layer 43, 44, and then filling the openings with electrically conductive material, e.g., metals, doped semiconductors and combinations thereof. For examples, the contacts Vin1, Vin2 to the first and second gate structures 45a, 45b, 55a, 55b are formed by forming a vertically orientated opening, i.e., via, through the interlevel dielectric layer 43, 44, and filling the opening with a metal. The via opening may be formed using photolithography and etch processes. For example, a photoresist mask may be formed exposing the portion of the dielectric material layers in which the via opening is to be formed, wherein following formation of the photoresist mask, the via opening may be etched into the interlevel dielectric 43, 44 using an etch process, such as reactive ion etch (RIE). The via opening may be filled with a metal, such as copper, aluminum, titanium, tungsten, platinum or combinations thereof. The electrically conductive material may be deposited into the via opening using physical vapor deposition (PVD). Examples of PVD processes suitable for depositing the metal for the contacts Vin1, Vin2 to the gate structures 45a, 45b, 55a, 55b include plating, electroplating, electroless plating, sputtering and combinations thereof.

Figure 14A:
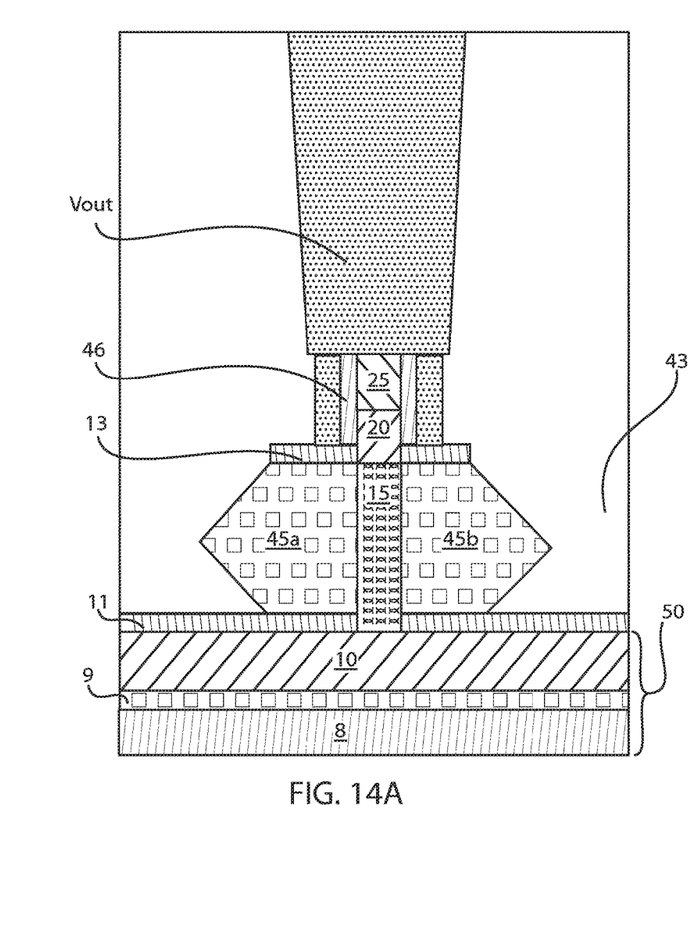
FIG. 14A is a side cross-sectional view depicting forming contacts to the JFETS 100, 200.
Figure 14B:
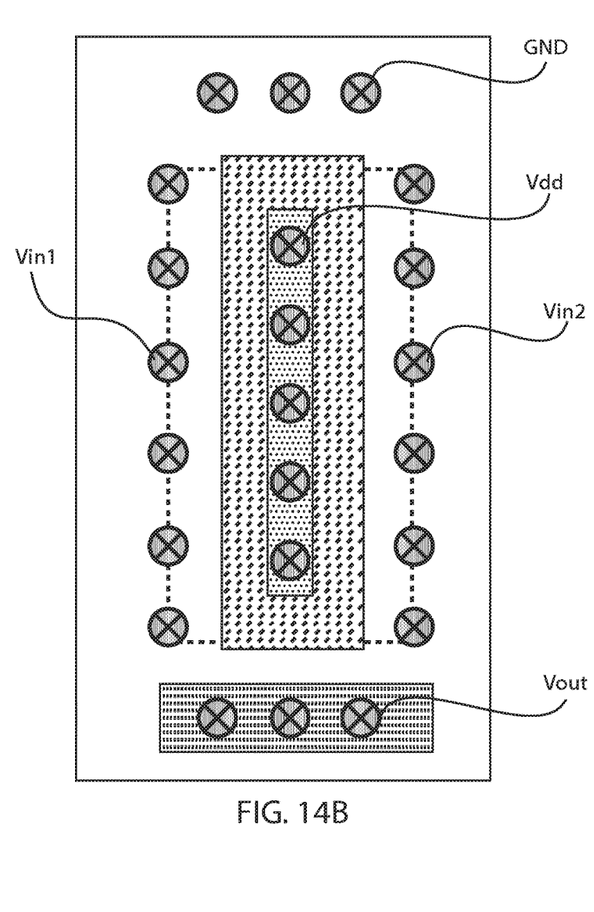
FIG. 14B is a top down view of the strapped contact depicted in FIG. 14A.

The contact Vout to the commonly electrically contacted source/drain region 20, 25 may include a vertically orientated, e.g., via portion, and a laterally orientated portion. Forming the contact to the commonly electrically contacted source/drain region 20, 25 may begin with removing the dielectric source/drain spacer layer 14. Removing the dielectric source/drain spacer layer 14 may begin with forming a via exposing a portion of the dielectric source/drain spacer layer 14. Thereafter, an isotropic etch may be introduced through the via to remove the dielectric source/drain spacer layer 14 providing a lateral opening to the commonly electrically contacted source/drain region 20, 25. Examples of isotropic etch processes include plasma etching, gas etching or wet etching process. In some embodiments, a metal may be applied through the lateral opening to form a metal semiconductor alloy 46, e.g., silicide, on the commonly electrically contacted source/drain region 20, 25. Thereafter, the via and the lateral opening may be filled with a metal providing the contact Vout to the commonly electrically contacted source/drain region 20, 25. The metal may be one of copper, aluminum, titanium, tungsten, platinum or combinations thereof. The electrically conductive material may be deposited into the via opening and the lateral opening using physical vapor deposition (PVD). Examples of PVD processes suitable for depositing the metal for the contacts Vdd to the commonly electrically contacted source/drain region 20, 25 include plating, electroplating, electroless plating, sputtering and combinations thereof. The contact Vout to the commonly electrically contacted source/drain region 20, 25 may be referred to as a strapped contact.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed. The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of forming a semiconductor device comprising:
    forming a trench through a multi-layered stack including a semiconductor material layer at a base of the trench;
    epitaxially forming a semiconductor stacked structure in the trench, the semiconductor stacked structure including a first intrinsic channel on the semiconductor material layer, a first conductivity doped source/drain region on the first intrinsic channel, a second conductivity doped source/drain region on the first conductivity doped source/drain region, and a second intrinsic channel;
    recessing the multi-layered stack to expose at least the first intrinsic channel;
    forming a first gate conductor in direct contact with the first intrinsic channel to provide a first JFET device; and
    forming a second gate conductor in direct contact with the second intrinsic channel to provide a second JFET device.

2. The method of claim 1, wherein the semiconductor material layer at the base of the trench is doped to provide a first conductivity type.

3. The method of claim 2, further comprising forming an epitaxial semiconductor material doped of a second conductivity type on a second end of the second intrinsic channel that is opposite a first end of the second intrinsic channel that is contact with the second conductivity doped source/drain region.

4. The method of claim 3, wherein the first conductivity type for the first JFET is n-type, and the second conductivity type for the second JFET is p-type.

5. The method of claim 4, further comprising forming a strapped contact in simultaneous electrical contact to the first conductivity doped source/drain region and the second conductivity doped source/drain region and a output node.

6. The method of claim 5, wherein the first JFET is a four terminal device, and the method further comprises forming a ground contact from the semiconductor material layer that provides a source region at the base of the trench to ground, a first voltage input contact to a first side of the first gate conductor, and a second voltage input contact to a second side of the first gate conductor.

7. The method of claim 5, wherein the second JFET is a four terminal device, and the method further comprises forming a power contact from the epitaxial semiconductor material doped of the second conductivity type on the second end of the second intrinsic channel to the power supply, a first voltage input contact to a first side of the second gate conductor, and a second voltage input contact to a second side of the second gate conductor.

8. The method of claim 1, wherein said forming the first gate conductor in direct contact with the first intrinsic channel to provide a first JFET device comprises epitaxial growth of a doped semiconductor gate conductor.

9. The method of claim 1, wherein said forming the second gate conductor in direct contact with the second intrinsic channel to provide a second JFET device comprises epitaxial growth of a doped semiconductor gate conductor.

* * * * *